United States Patent
Jensen et al.

(10) Patent No.: US 8,401,820 B2
(45) Date of Patent: Mar. 19, 2013

(54) IN SITU HEALTH MONITORING OF PIEZOELECTRIC SENSORS

(75) Inventors: Scott L. Jensen, Carriere, MS (US); George J. Drouant, Mandeville, LA (US)

(73) Assignee: United States of America as Represented by the Administrator of the National Aeronautics and Space Administration, Washington, DC (US)

( * ) Notice: Subject to any disclaimer, the term of this patent is extended or adjusted under 35 U.S.C. 154(b) by 310 days.

(21) Appl. No.: 12/566,111

(22) Filed: Sep. 24, 2009

(65) Prior Publication Data

US 2010/0088067 A1    Apr. 8, 2010

Related U.S. Application Data

(60) Provisional application No. 61/102,556, filed on Oct. 3, 2008.

(51) Int. Cl.
*G01H 11/08* (2006.01)
*G06F 15/00* (2006.01)

(52) U.S. Cl. ........ 702/182; 702/183; 702/184; 702/185; 324/527

(58) Field of Classification Search .......... 702/182–185; 324/527, 601, 710, 727; 330/2, 51, 127–142, 330/174
See application file for complete search history.

(56) References Cited

U.S. PATENT DOCUMENTS

| | | | |
|---|---|---|---|
| 5,321,332 A * | 6/1994 | Toda | 310/322 |
| 5,753,793 A | 5/1998 | Lindahl et al. | |
| 5,895,858 A | 4/1999 | Malone et al. | |
| 7,042,228 B2 * | 5/2006 | Lally et al. | 324/527 |
| 2008/0089392 A1 * | 4/2008 | Anglin, Jr. | 375/139 |

OTHER PUBLICATIONS

W. Atherton et al., A Self Diagnostic System for Piezoelectric Sensors, AIAA/ASME/SAE/ASEEE 25th Joint Propulsion Conference, Jul. 10-12, 1989, AIAA 89-2638, Monterey, CA.
P.M. Flanagan et al., Developing a Self-Diagnostic System for Piezoelectric Sensors, AIAA/SAE/ASME/ASEE, 26th Joint Propulsion Conference, Jul. 16-18, 1990, AIAA 90-2230, Orlando, FL.
P. Flanagan, Design of a self-compensation system for piezoelectric accelerometers, AIAA/ASME/SAE/ASEE 32nd Joint Propulsion Conference and Exhibit, Jul. 1-3, 1996, AIAA 96-2935, Buena Vista, FL.
P. Flanagan, In-situ Measurement of Sensitivity for a Piezoelectric Sensor, AIAA/SAE/ASME/ASEE 27th Joing Propulsion Conference, Jun. 24-26, 1991, AIAA 91-2521, Sacramento, CA.
B. Liu, Transducers for Sound and Vibration—The Finite Element Method Based Design, Department of Manufacturing Engineering and Management, Technical University of Denmark, Jun. 2001, Publ. No. IPL-055-01, Denmark.
T. Licht, In-situ Verification of Accelerometer Function and Mounting, Technical Review, Bruel & Kjaer, 1996, pp. 32-41, No. 1—1996.
G. Park et al., Piezoelectric Active Sensor Self-Diagnostics using Electrical Admittance Measurements, ASME Journal of Vibration and Acoustics, 128 (4), 469-476, 2006.
S. Gade et al., A Simple QC Test for Knock Sensors, Technical Review, Bruel & Kjaer, 1997, pp. 12-23, No. 1—1997.

(Continued)

*Primary Examiner* — Sujoy Kundu
(74) *Attorney, Agent, or Firm* — Randall M. Heald; B. Delano Jordan

(57) ABSTRACT

An in situ health monitoring apparatus may include an exciter circuit that applies a pulse to a piezoelectric transducer and a data processing system that determines the piezoelectric transducer's dynamic response to the first pulse. The dynamic response can be used to evaluate the operating range, health, and as-mounted resonance frequency of the transducer, as well as the strength of a coupling between the transducer and a structure and the health of the structure.

21 Claims, 10 Drawing Sheets

OTHER PUBLICATIONS

G. Stultz et al., Total Quality with Rapid Through-put of Powdered Metal and Cast Parts for Whole Part Flaw Detection via Resonant Acoustic Method of Inspection, Technical Paper, SAE, No. 2003-01-3700, 2003, Warrendale, PA.

P. Flanagan et al., A Self-Diagnostic System for the M6 Accelerometer, AIAA/SAE/AIChE/ASME 37th Joint Propulsion Conference and Exhibit, Jul. 8-11, 2001, AIAA 2001-3318, Salt Lake City, UT.

* cited by examiner

US 8,401,820 B2

IN SITU HEALTH MONITORING OF PIEZOELECTRIC SENSORS

CROSS-REFERENCE TO RELATED APPLICATIONS

This application claims the benefit of priority from U.S. Provisional Application Ser. No. 61/102,556, filed on Oct. 3, 2008.

ORIGIN OF THE INVENTION

The invention described herein was made in the performance of work under a NASA contract and by an employee of the United States Government and is subject to the provisions of Section 305 of the National Aeronautics and Space Act of 1958, as amended, Public Law 85-568 (72 Stat. 435, 42 U.S.C. §2457), and may be manufactured and used by or for the Government for governmental purposes without the payment of any royalties thereon or therefore.

BACKGROUND OF THE INVENTION

1. Field of the Invention

Embodiments of the invention generally relate to piezoelectric transducers. In particular, embodiments relate to the in situ testing of piezoelectric transducers.

2. Discussion

On occasion, anomalies may appear in the highly dynamic test data obtained during rocket engine tests. Each data anomaly occurring during a test program is typically investigated and appropriate corrective action may be mandated before the test program is permitted to continue with subsequent testing. Due to condensed test schedules, only a few days may be generally allotted for identifying the cause of any anomaly and performing a corrective action.

A typical challenge might be the appearance of spurious signals in accelerometer data channels, wherein the origin of those signals may be unknown. An assumption might be made that the spurious signals have been caused by loose or broken accelerometers. In such a case, technicians might be sent to remove the accelerometers from the test article and check the mounting torque. The result could be the replacement of several transducers and costly delays. In some cases, only a small number of the accelerometers may be identified as defective, and the cause might never be conclusively identified. Simply put, it may often be unclear whether anomalies in recorded signals are due to differences between the data acquisitions systems, differences between the accelerometer, a failed accelerometer, or whether everything is working correctly and the systems are accurately recording real events. Indeed, currently, signal simulators, shakers, static pressures simulators, and in-house calibration systems may all be employed for monitoring the instrumentation components. Any component with questionable performance, i.e., anomaly present, may be sent out for extensive testing and high-quality calibration. In addition, all the instrumentation accelerometers can be put on a rotational calibration schedule to be removed and sent off to a calibration laboratory, which can further add to costs and delay.

BRIEF DESCRIPTION OF THE DRAWINGS

The various advantages of the embodiments of the present invention will become apparent to one skilled in the art by reading the following specification and appended claims, and by referencing the following drawings, in which:

DETAILED DESCRIPTION OF THE INVENTION

Figure 1:
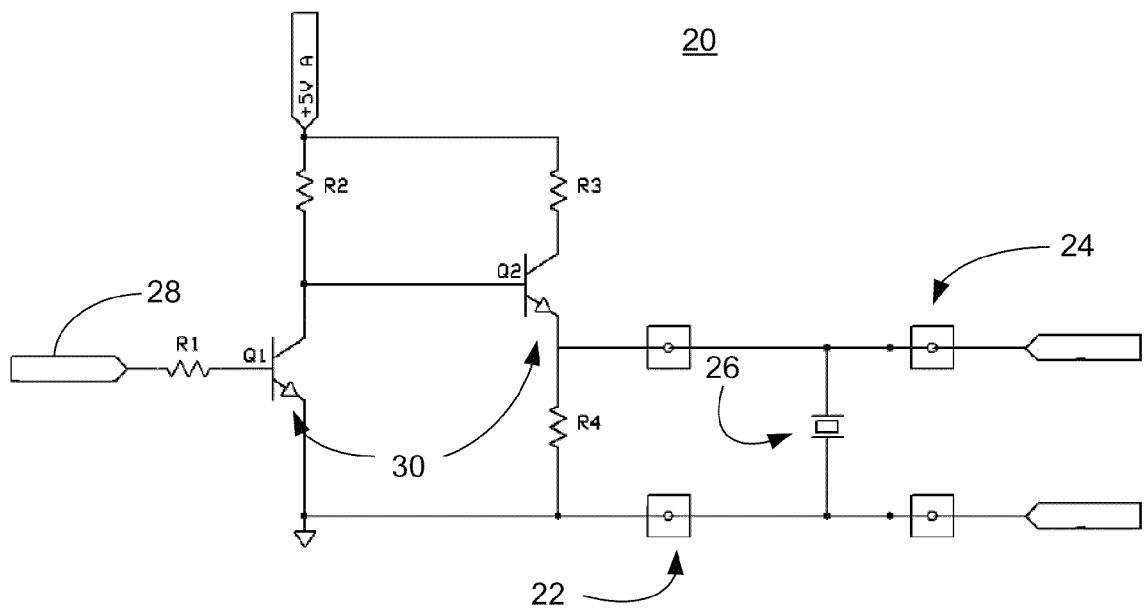
FIG. 1 is a schematic diagram of an example of an exciter circuit according to an embodiment.

Embodiments of the present invention provide for an apparatus having an exciter circuit to transmit a pulse to a piezoelectric transducer and a data processing system to determine the piezoelectric transducer's dynamic response to the pulse, wherein the first pulse is to be a single positive pulse and the dynamic response is to be a wideband frequency response.

Embodiments of the present invention also provide for an apparatus with a controller to generate a first trigger signal and a second trigger signal. The apparatus may further include an exciter circuit to transmit a plurality of first pulses to a piezoelectric accelerometer in response to the first trigger signal and transmit a plurality of second pulses to the piezoelectric accelerometer in response to the second trigger signal. The apparatus may also include a data processing system to determine a first set of spectrum response data based on the piezoelectric accelerometer's dynamic response to the plurality of first pulses, and to determine a second set of spectrum response data based on the piezoelectric accelerometer's dynamic response to the plurality of second pulses. The data processing system may also be configured to generate a polar plot based on the first and second sets of spectrum response data.

Embodiments of the present invention also provide for a method in which a pulse is transmitted to a piezoelectric transducer. The method may also provide for determining the piezoelectric transducer's dynamic response to the pulse, wherein the first pulse is a single positive pulse and the dynamic response is a wideband frequency response.

In an effort to enhance facility capabilities, consideration can be made to adding in situ test systems to existing dynamic instrumentation. In situ tests can determine if sensors such as piezoelectric accelerometers (e.g., transducers) and other piezoelectric elements are operating properly or if the sensors are in error. Such an approach may reduce the cost incurred from utilizing existing off-line testing systems.

Piezoelectric transducers can generate electric charges in response to mechanical deformation of the materials from which they are made. Pierre and Jacques Curie discovered this phenomenon in the 1880s. The first application of the piezoelectric effect was the detection of submarines during World War I. They also demonstrated the inverse piezoelectric effect in which an electric field applied across a piezoelectric material deforms mechanically. The inverse piezoelectric effect may not be utilized, however, to its full ability. In particular, it can be used for testing piezoelectric transducers while they are mounted to a structure. It also has the potential to detect structural changes in a test article. This kind of testing capability would reduce the chance of using improperly mounted transducers or faulty transducers.

Such a test method could also be used to monitor transducers between tests to detect any trends indicative of transducer failure or detachment. Utilizing this effect as an operational monitor has the potential to enhance the capabilities of piezoelectric instrumentation systems throughout industry.

Piezoelectric transducers can use the direct piezoelectric effect for generating electric charges in response to mechanical deformation of the materials from which they are made. The piezoelectric phenomenon may also be reversible. For example, Gabriel Lippmann in 1881 deduced the converse effect from thermodynamic principles. Pierre and Jacques Curie then correspondingly demonstrated the converse piezoelectric effect in which an electric field applied across a piezoelectric material deforms mechanically. Since then piezoelectric technologies may have been employed in a wide range of products. Piezo buzzers, microphones, quartz clocks, ultrasonic transducers, high voltage igniters, microbalances, sonar transducers, inkjet printers, guitar pick-ups, electronic drum pads, and ultra fine optical focus assemblies are only a few products that might use piezoelectric technology. Accelerometers and pressure transducers may be among the most common uses of piezoelectric devices for measuring physical quantities.

The piezoelectric effect can be used to build a bench top tester and a field deployable test unit. Facility installable test components may also be constructed using the principles described herein. A bench top tester formed in accordance with an embodiment of the present invention accurately identifies, verifies, and/or establishes the operating condition (or health) of piezoelectric accelerometers in a laboratory environment. Test systems may also be expanded for use on piezoelectric transducers which contain charge converters by using an embeddable exciter circuit. The new component enables signal condition equipment to perform piezoelectric testing as part of the facilities instrumentation systems.

Propulsion test facilities may readily employ a variety of piezoelectric accelerometers and pressure transducers. These types of transducers can be excellent candidates for utilizing the converse effect for exciting resonate frequencies within a sensor element. The corresponding vibrations may propagate throughout the structures that are linked to the sensor. These vibrations can then be analyzed for nominal characteristics. The vibrations may change with any change in the sensor or structure. This is similar to a how a bell's tone changes when the bell is cracked. The signals produced by the piezoelectric sensor under test can be processed by testers to yield frequency spectrum information.

The general state of health of the sensor can be determined from the spectral analysis of the frequency information by revealing such things as the primary resonance frequency of the sensor, whether or not the sensor is still properly attached to the test article, as well as if the sensor is functioning normally. Embodiments of the present invention provide the ability to monitor piezoelectric transducers between propulsion tests to detect any trends indicative of transducer failure or detachment.

Embodiments are capable of evaluating a piezoelectric transducer's proper operation while it is installed, i.e., in situ. Degraded performance can be quickly and economically identified as a preventive measure with the testing system. Once an anomaly is discovered, it can be appropriately handled before significant repercussions occur.

The embodiments of the present invention are not limited to identifying degraded performance in a sensor's piezoelectric elements. Embodiments can detect changes within the entire sensor and sensor's housing. Embodiments are also capable of detecting the sensor's proper attachment to a test article. Even though the focus has been on the detection of improperly operating sensors, embodiments allow the evaluation of resonance characteristics of the surrounding structure with the use of specialized piezoelectric elements. Changes in a test article structure (such as stress induced cracking) may be revealed by such systems. This kind of response may be able to indicate prospective as well as actual failures in equipment, test articles, or defects in manufactured parts.

All structures have mechanical resonances, where the structure itself amplifies any mechanical energy imparted to it at certain frequencies. For example, tuning forks will vibrate at resonant frequencies when mechanically excited. By measuring the resonances of a part, one determines the structural characteristics of that part in a single test. A piezoelectric sensor has its own identifiable resonant characteristics, allowing the sensor to be tested while attached or unattached to the structure. Testing systems formed in accordance with certain embodiments can employ a technique that may be similar to the Non-Destructive Test-Resonant Acoustic Method (NDT RAM) systems used in manufacturing facilities.

Generally, a piezoelectric element can be used to impart mechanical energy into the system, and also sense how the system responds to that mechanical energy. The converse piezoelectric effect can cause the element to deform from the exciter circuit and this can correspondingly place mechanical energy into the system. The electrical energy that is not converted to mechanical energy may be stored in the element. This leftover energy can prevent the sensor element from accurately reading the system response from the imparted mechanical energy.

There are several conventional methods for removing the stored energy. All known methods may use complex input signals and elaborate switching for discharging the element's stored energy. Alternatively, the piezoelectric sensor testing systems of embodiments of the present invention may use a resistive path to ground. This novel solution can utilize a simple component to handle the complex discharging function, and further enables the test system's circuitry to effectively excite resonant frequencies with a purely positive pulse.

Turning now to FIG. 1, an exciter circuit 20 is shown. In the illustrated example, a transducer connected 22 and an output signal connector 24 are coupled to piezoelectric element 26, wherein a trigger signal is transmitted on trigger line 28. The exciter circuit 20 can use a transistor configuration 30 to apply a simple positive pulse across the piezoelectric element 26 in response to the trigger signal. The exciter circuit 20 can be employed in a wide range of applications, and can be a significant improvement over conventional circuits.

Figure 2:
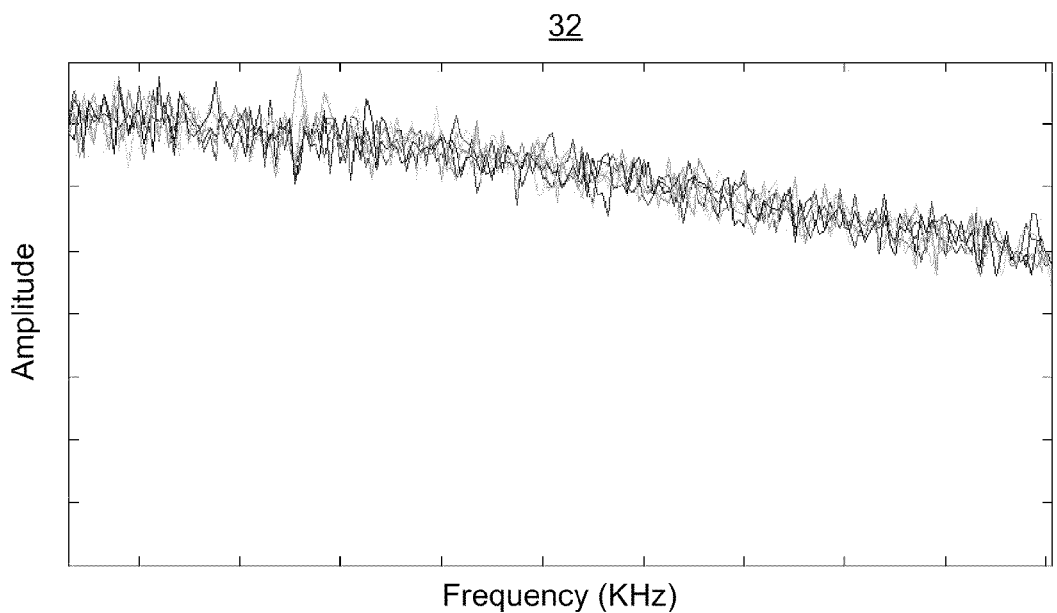
FIG. 2 is a frequency spectrum plot of an example of the energy of an applied single positive pulse according to an embodiment.
Figure 3:
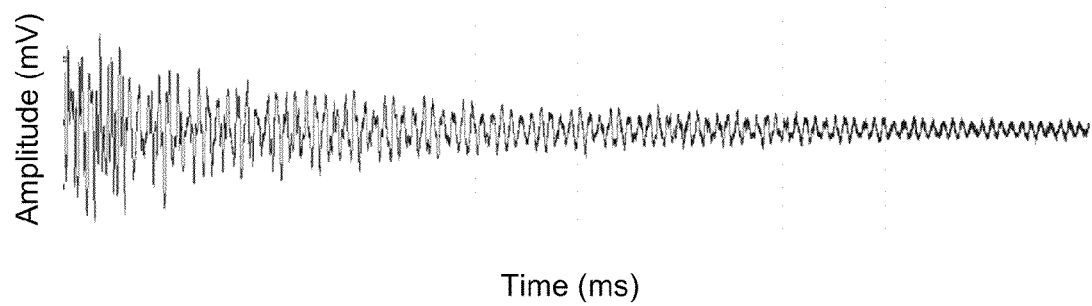
FIG. 3 is a time domain plot of an example of a piezoelectric transducer's dynamic response to a pulse according to an embodiment.

FIG. 2 shows a frequency spectrum plot 32 demonstrating the energy of an applied single positive pulse, which can impart energy over a wide frequency range. In one example, a pulse width of one micro-second can be chosen to excite the piezoelectric elements. A one microsecond square pulse consistently contains distributed energy in frequencies up to 150 kilohertz (kHz). The 3 dB down point for the amplitude frequency spectrum of the pulse is approximately 200 kHz. This wide band of energy can excite the piezoelectric element's primary resonant frequency without any prior knowledge of the primary resonant frequency. Because the primary resonant is generally different for different sensors, there is no need to change the injected signal to target a particular sensor's resonant frequency. Conventional assemblies may target the primary resonant, subsequently limiting the system's versatility. Exciting a wide range of frequencies also has the added advantage of exciting all the resonant frequencies rather than just the primary frequency. This is a unique feature of illustrated example that provides an abundant amount of information in the resonant response. FIG. 3 shows a time domain plot 34 of a piezoelectric element's excited resonant frequency.

Figure 4:
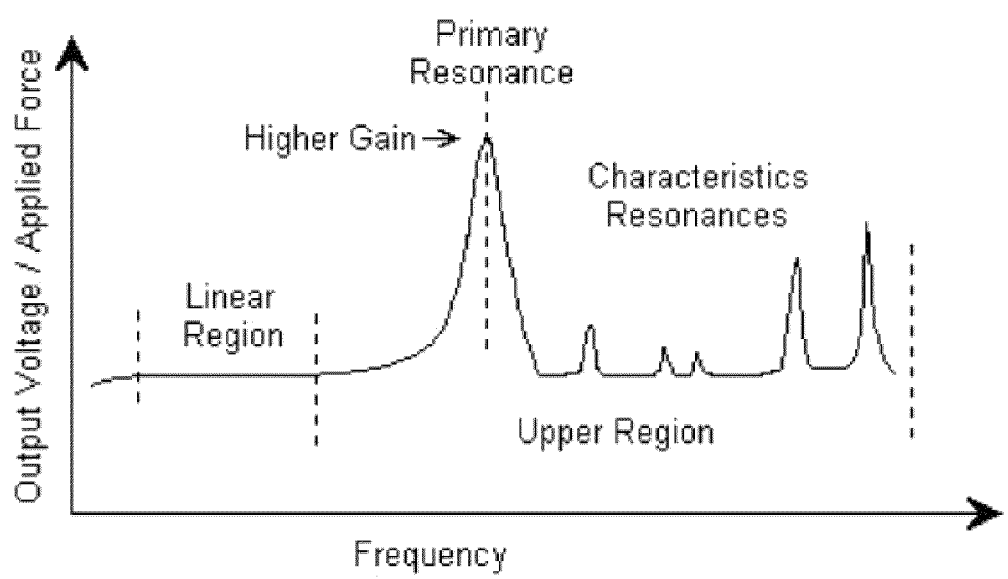
FIG. 4 is a waveform diagram of an example of a piezoelectric transducer's frequency regions according to an embodiment.

Turning now to FIG. 4, a diagram of a typical sensor's frequency regions is shown in a plot 36. The illustrated linear or "flat" region of a piezoelectric device's amplitude response (frequencies below resonance) generally defines the device's measurement range. Sensors typically utilize the flat region of the piezoelectric frequency response for measuring physical quantities. The flat region can produce a steady output level for all frequencies contained in the region. Put another way, the flat region may predict the sensor's usable input range. The region above the flat band produces significant fluctuations corresponding to the sensor's resonant frequencies. Essentially, the output signal can have a higher gain at the resonant frequencies. The high-frequency region containing the resonances may have unique characteristics. Some of these characteristics are generally the same for a family of sensors, such as the primary resonant. Other characteristics may be unique to each sensor. This can be analogous to the uniqueness of a human finger print. Other characteristics may be unique to the sensor's environment, such as the mounting torque. The sensor's ability to maintain a consistently flat region of the operational frequencies can be important, and changes in the upper frequency regions may be reliable indicators that the flat region will be correspondingly affected. The operating condition (or health) of a piezoelectric sensor can be identified, verified and/or established by analyzing these frequency characteristics. A frequency range of 10 kHz to 100 kHz normally contains the pertinent information.

The primary resonant frequency is identifiable by the first large amplitude peak outside the flat band. The mounted primary resonance frequency may be accurately measured by the manufacturer at calibration. The mounted primary resonance frequency can commonly be used to determine if a sensor is operating properly. The developed testing systems can easily determine the as-mounted primary resonant frequency. The in situ test performed in accordance with embodiments of the present invention enables the determination of the transducer's health and if the transducer is properly mounted to the test article without removing it from the test article. The as-mounted resonant frequencies can be especially difficult to determine in a real world environment without the testing systems developed in accordance with embodiments of the present invention. The piezoelectric sensor testing system described herein can effortlessly measure these frequencies, enabling on-the-spot decisions to be made about the sensor's operational condition.

Figure 5:
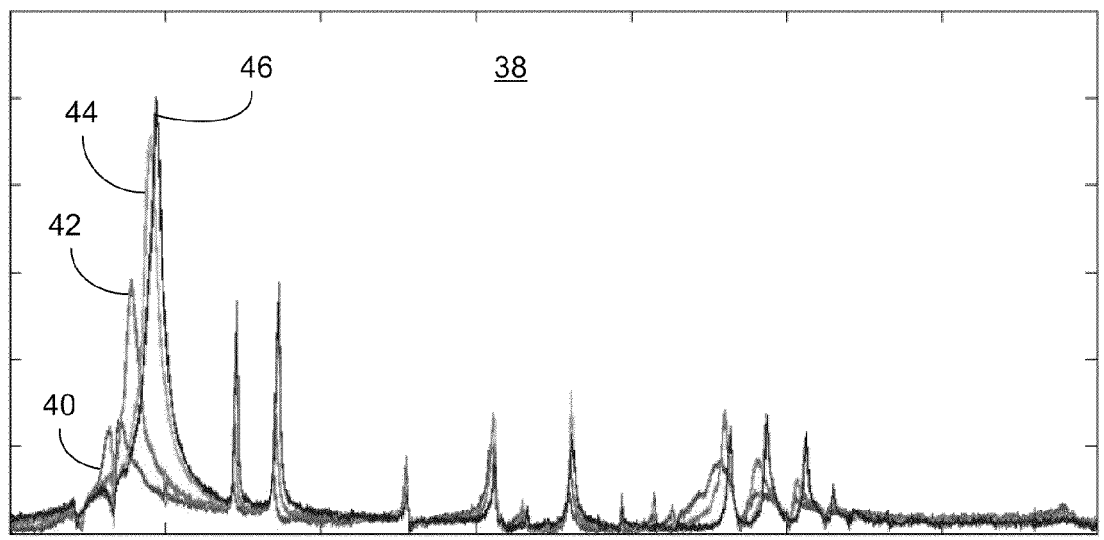
FIG. 5 is a frequency domain plot of an example of a piezoelectric transducer's as-mounted dynamic response to a pulse at various torque levels according to an embodiment.

FIG. 5 shows a frequency spectrum plot 38 of a mounted accelerometer's response to the exciter at various torque levels. The structural coupling between the sensor and a test article can produce a recognizable shift in the sensor's primary resonant frequency. Sensors constructed with threaded assemblies can vary the level of structural coupling through the degree of mounting torque applied. For example, curve 40 shows the dynamic response for 10 in-lbs of torque, curve 42 shows the dynamic response for 20 in-lbs of torque, curve 44 shows the dynamic response for 30 in-lbs of torque, and curve 46 shows the dynamic response for 40 in-lbs of torque. Accordingly, embodiments of the present invention can identify the degree to which a sensor is structurally coupled to a test article or other structure. This approach detects if a sensor is properly attached without having to remove it from the test article. Previously, it has been difficult or impossible and labor intensive to detect if a sensor has vibrated loose or debonded from a test article.

Because frequency characteristics are interconnected, it may typically be impractical to correlate a cause with a particular change in the characteristics. A few key causes can be correlated, however, if an excellent understanding of a structure is known. The sensor mounting and sensor housing are well defined structures. This information provides a knowledge base for correlating key attributes to frequency characteristics. Test articles, on the other hand, may often be inadequately understood, thereby making good correlations difficult. Nonetheless, immediately identifying a cause due to a change in the structure may be rarely required. It is generally more important to identify that a change has occurred, which can be rather straightforward using the techniques described herein. For example, initial characteristics as a whole can be compared to subsequent characteristics to determine whether and how much change may have occurred. Piezoelectric sensor testing embodiments can measure the response over a wide band of frequencies. Consequently, comprehensive comparisons from initial conditions to subsequent conditions can be made.

Figure 6:
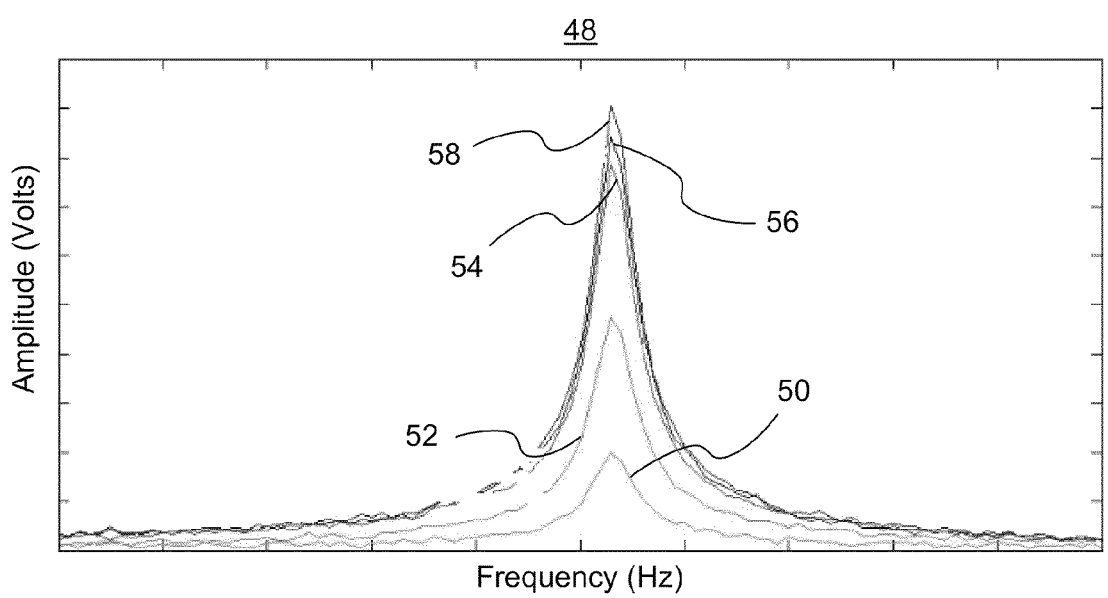
FIG. 6 is a frequency domain plot of an example of a piezoelectric transducer's dynamic response to a pulse at various excitation levels according to an embodiment.
Figure 7:
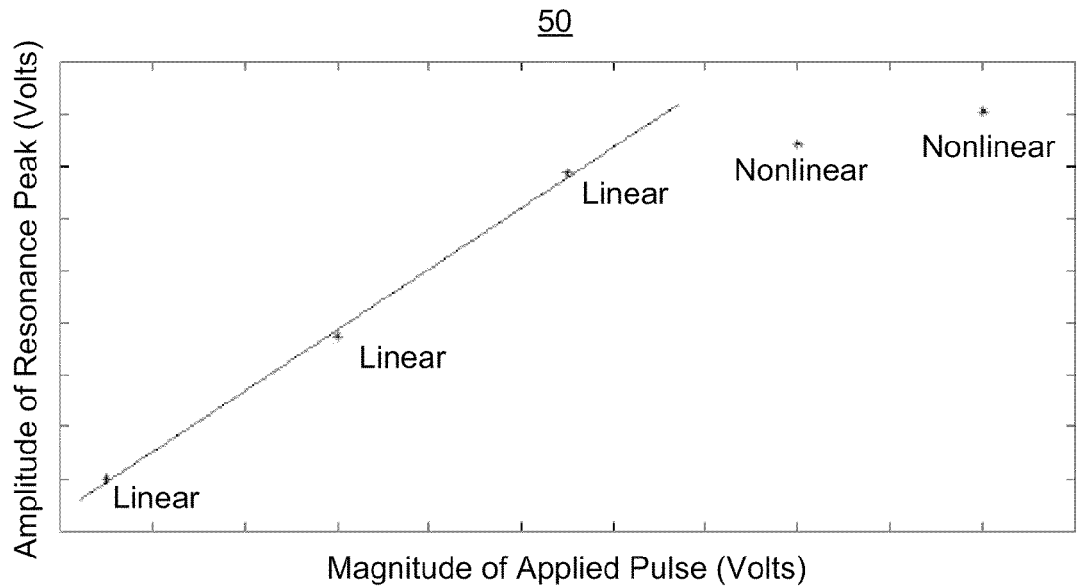
FIG. 7 is a data plot of an example of a resonance peak amplitude at various excitation levels according to an embodiment.

FIGS. 6 and 7 show a signal degradation graph 48 demonstrating the result of exciting a piezoelectric accelerometer into saturation and a plot of the nonlinear response resulting from an overly charged piezoelectric accelerometer, respectively. In particular, curve 50 shows the signal amplitude for a 2.5 V excitation, curve 52 shows the signal amplitude for a 5 V excitation, curve 54 shows the signal amplitude for a 7.5 V excitation, curve 56 shows the signal amplitude for a 10 V excitation and curve 58 shows the signal amplitude for a 12 V excitation. In this regard, it may be important to maintain the linear operational range of a sensor because the data received from the sensor when the piezoelectric element's operation is nonlinear may be distorted. Therefore, during nonlinear operation the amount of energy imparted to the piezoelectric element from the exciter circuit may also be unpredictable. Fundamentally, the direct or converse piezoelectric effects are irregular under saturation. If the piezoelectric sensor testing systems inject an exciter pulse with too much energy the sensor may become saturated.

The sensor's highly dynamic response to the exciter pulse can produce a massive amount of data. So, large data sets can be recorded with a piezoelectric testing system in order to adequately capture the frequency characteristics. The large amount of data may be efficiently analyzed for identifying changes in the test results. Two main processes (e.g., MatLab functions) can be created for handling the huge amounts of data.

The first process may read in the recorded data sets and perform a Fast Fourier Transform (FFT). Power spectral density, amplitude spectral density, and frequency spectrum waterfall plots can then be made and examined. This approach reveals the frequency content from the time domain data. The data in this format can be immensely useful in identifying resonant frequencies and linear operational region. However, this information may need to be interpreted by an individual with an in-depth knowledge of signal processing and the system under test. The data contains such a vast amount of information that it can be extremely difficult to identify relevant changes. An individual might only be able to identify major changes from the data when it is in this format. Such a comparison may also be subjective. The second process may involve a comparison approach that can deal with the these issues by employing a modified version of the Data Analysis by Vector Evaluation (DAVE) algorithm for comparing large data sets. In the 1980s the DAVE algorithm was developed by F. Stone and M. Badinger to detect differences between chromatograms.

The basic idea behind the comparison approach is the transformation of data sets into multidimensional vectors. The differences in the magnitudes and angles of the vectors may then be computed. The results can then be displayed in an evaluation output such as a two dimensional polar plot, thus simplifying the multidimensional data into a two dimensional representation. The FFT data set is the spectrum of a sensor's response to the excitation pulse, and the comparison approach can represent it in a vector. Each value of an FFT data set (e.g., a frequency bin) may be represented as one dimension of the multidimensional vector. If the data sets are identical, the comparison approach finds no difference between the data sets and produces a point in the center of a polar plot. The distance from the center of the plot to the point would be zero. Such a result indicates that the vector amplitudes are the same and that no angle exists between the vectors. The larger the angle and amplitude the greater the differences are between the data sets. Fundamentally, the comparison approach can quickly condense large amounts of data into a polar plot capable of quantifying small changes between the large data sets. Sensor diagnoses can be made by applying predefined limits to the polar plot that are linked to a specific structure and sensor type. Automated indication could also be implemented with the polar plot limits. Additionally, pattern recognition techniques may be able to automatically discern even more information.

Figure 8:
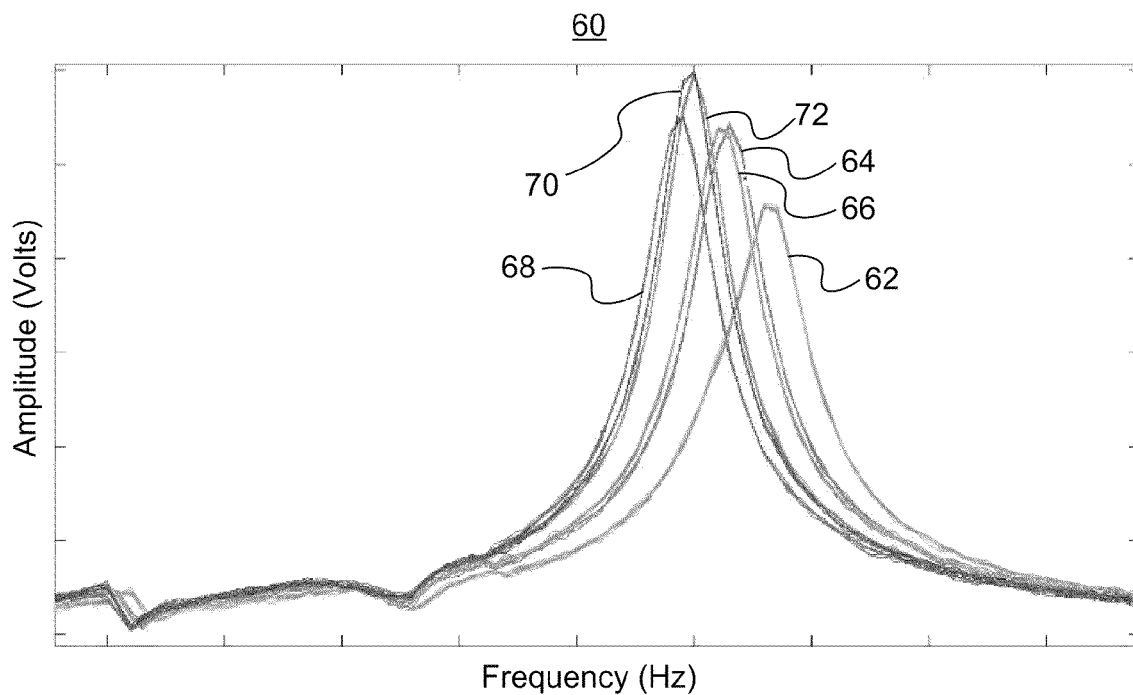
FIG. 8 is a frequency domain plot of an example of a piezoelectric transducer's as-mounted dynamic response to a pulse at various temperatures according to an embodiment.

Turning now to FIG. 8, a frequency spectrum plot 60 of a mounted accelerometer's primary resonant frequency at various temperatures is shown. In the illustrated example, curve 62 shows the dynamic response at 69° F., curve 64 shows the dynamic response at 98° F., curve 66 shows the dynamic response at 100° F., curve 68 shows the dynamic response at 116° F., curve 70 shows the dynamic response at 117° F., and curve 72 shows the dynamic response at 118° F. Thus, thermal effects on the piezoelectric elements may add another level of complexity to interpreting the frequency characteristics and the temperature of the piezoelectric element may alter the frequency characteristics. The impact can be significant enough to indicate something has taken place in the transducers that warrant examination. It has been determined, however, that the thermal effects may naturally alter the primary resonate frequency in a predictable manner that can be correlated for a given transducer type. Indeed, the transducer's temperature can go unknown at the time of test with an established thermal correlation to the primary resonates. If the correlation cannot be established, the temperature of the transducer under test may be advantageous. In addition, temperature compensation techniques may be utilized to minimize the impact of temperature variations.

Piezoelectric testers created in accordance with embodiments of the present invention can be used on a wide variety of piezoelectric transducer types within numerous applications without modification. Each transducer type and each application may change, however, the way the resultant frequency characteristic should be interpreted. The testing systems of embodiments of the present invention are innovative in the way they gather the resonant frequencies characteristics, but the interpretation of the frequency characteristics may be user specific. The diagnosis of a transducer's operational condition can be linked to the specific transducer, transducer bonding, surrounding structure, and test conditions. The testing systems could be very effective in combination with modal analysis techniques as well as non-destructive testing programs. Some common transducer configurations utilized in propulsion testing already have been analyzed, enabling users to make valuable interpretations.

Figure 9:
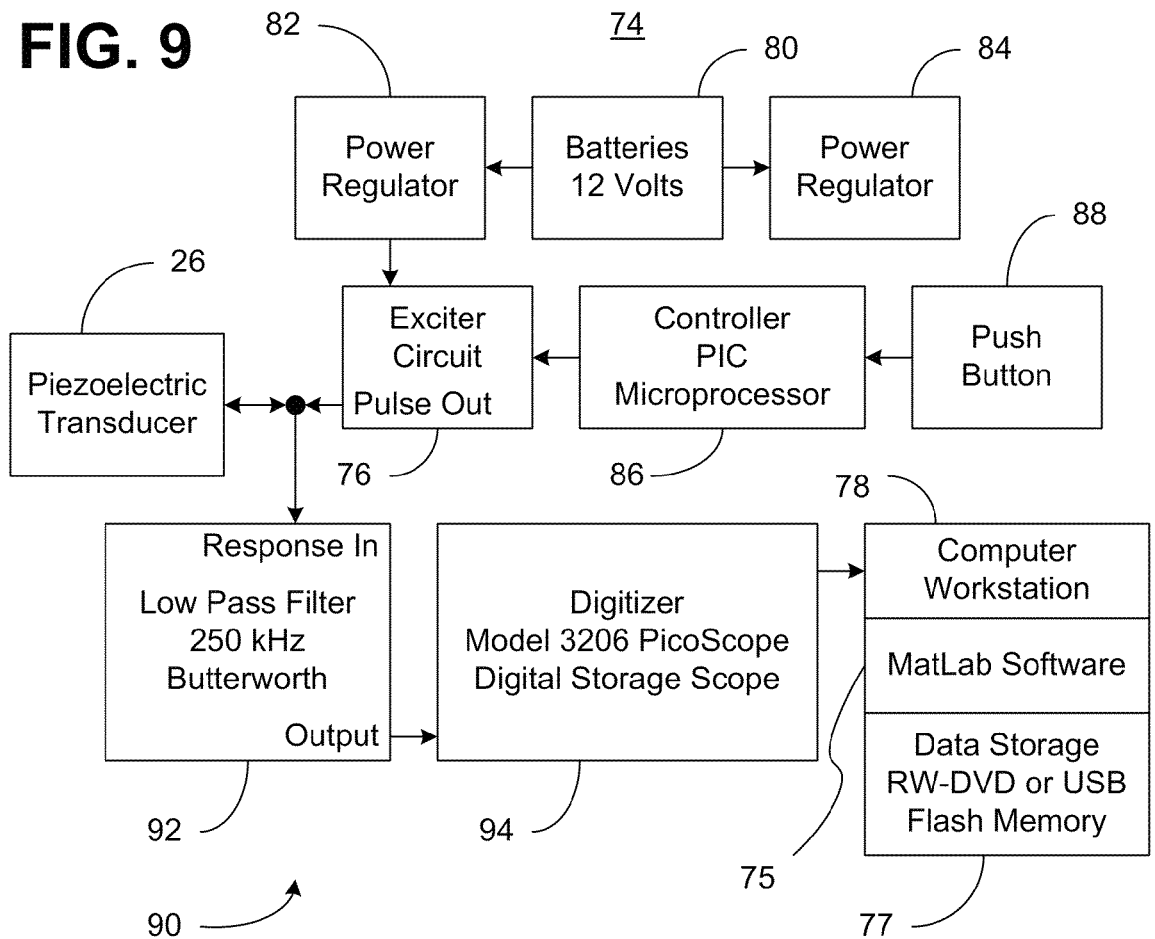
FIG. 9 is a block diagram of an example of a bench top tester according to an embodiment.

FIG. 9 shows a bench top tester system 74. The illustrated tester system 74 includes a push button 88, a manually triggered exciter circuit 76, a data collection unit 90, and a workstation computer 78 having a data processing system 75 and data storage 77. The exciter circuit 20 (FIG. 1), already discussed, may be readily substituted for the illustrated exciter circuit 76. The exciter circuit 76 can be powered by a 12 volt battery 80 regulated into two positive 5 V outputs by power regulators 82, 84. One of the regulated battery outputs may power a PIC (Peripheral Interface Controller) microprocessor 86, and the other regulated battery output can be used to power the pulsar circuitry. The illustrated microprocessor 86 controls the pulsar's activation and the duration of the output pulse. The pulsar circuitry can impart the appropriate energy into a connected piezoelectric transducer, and bleed off the extra energy from the transducer's element. The transducer output may be filtered with a 250 kHz Low Pass Butterworth filter circuit 92. The filtered output can be digitized by a digital storage scope 94 at a rate of 125000 samples per second. The signal may be captured for ten milliseconds with the scan initiated on a 20 mV falling edge of the pulse. Six data sets can be taken from six consecutive sensor excitations, wherein each data set may be considered a set of spectrum response data. The captured data sets may then be imported into a process such as a MatLab function.

Figure 10:
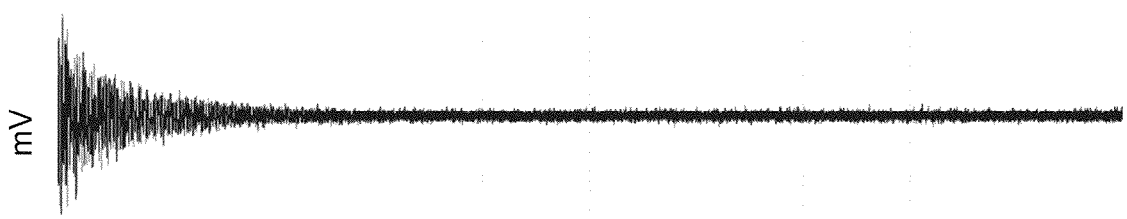
FIG. 10 is a frequency domain plot of an example of a data set capture according to an embodiment.

FIG. 10 shows a plot 96 of a captured data set from a piezoelectric accelerometer. An FFT process can be executed on each data set, wherein each FFT data set may be formatted into a set of 100 Hz frequency bins from 100 Hz to 200 kHz. This data may then be saved for review. The DAVE-based comparison approach already discussed may then be used to compare multiple groups of six FFT data sets.

Figure 11:
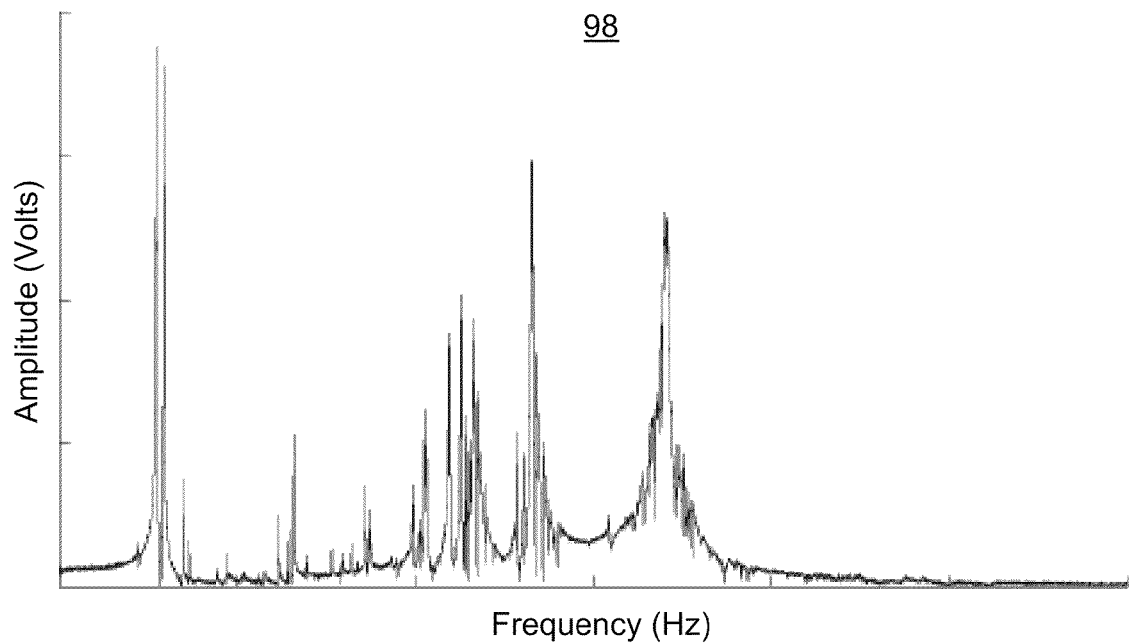
FIG. 11 is a frequency domain plot of an example of an amplitude spectral density according to an embodiment.

Turning now to FIG. 11, an amplitude spectral density plot 98 of an accelerometer's frequency characteristics is shown.

The illustrated approach is therefore well suited for collecting the fundamental operating frequency characteristics of a transducer for future comparisons. Other uses include, but are not limited to, determining whether transducers are working properly without any previously known operating characteristics.

Figure 12:
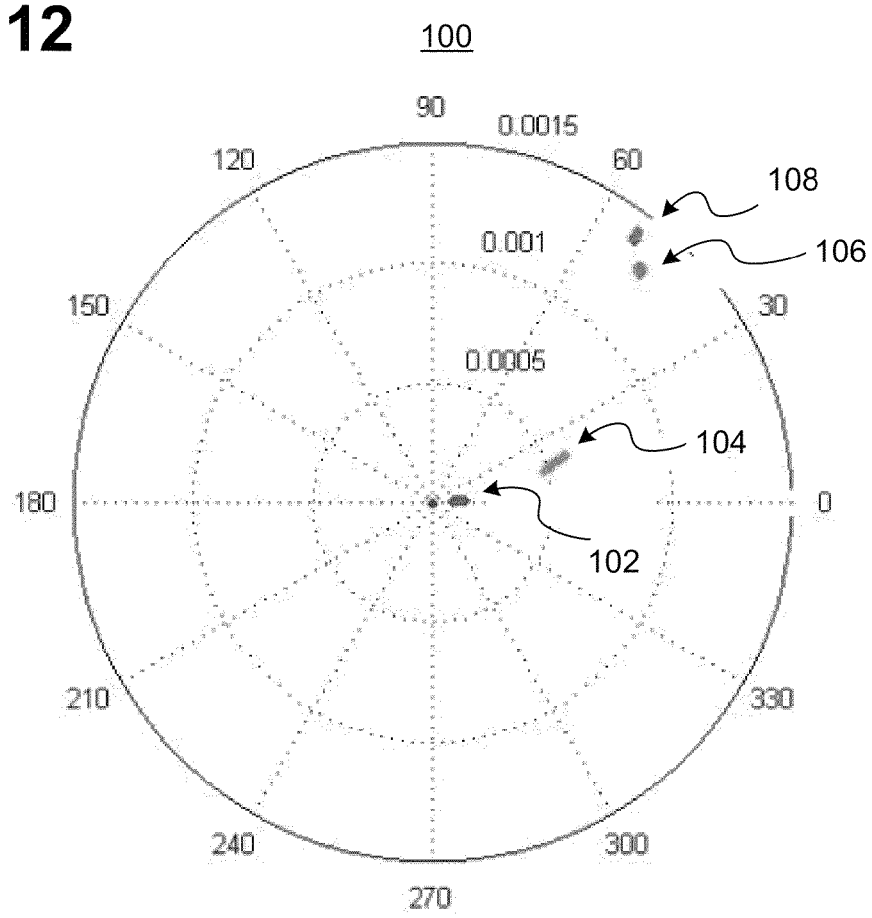
FIG. 12 is a polar plot of an example of a piezoelectric transducer with a proper dynamic response in a torque test according to an embodiment.

A particular example of the successful utilization of an embodiment the present invention is a bench top torque test for a piezoelectric accelerometer, where the accelerometer is mounted to a steel block weighing at least 100 times greater than the accelerometer. FIG. 12 shows a polar plot of data taken from an accelerometer with a proper response from the torque test. In the illustrated example, frequency characteristics are measured with an accelerometer successively mounted using increasing torque levels. In particular, data cluster 102 represents the accelerometer's dynamic response to the pulse at 40 in-lbs of torque, data cluster 104 represents the accelerometer's dynamic response to the pulse at 30 in-lbs of torque, data cluster 106 represents the accelerometer's dynamic response to the pulse at 20 in-lbs of torque, and cluster 108 represents the accelerometer's dynamic response to the pulse at 10 in-lbs of torque. Each of the collected data groups are then compared to the 40 inch pounds of torque data group by the comparison approach already discussed.

Figure 13:
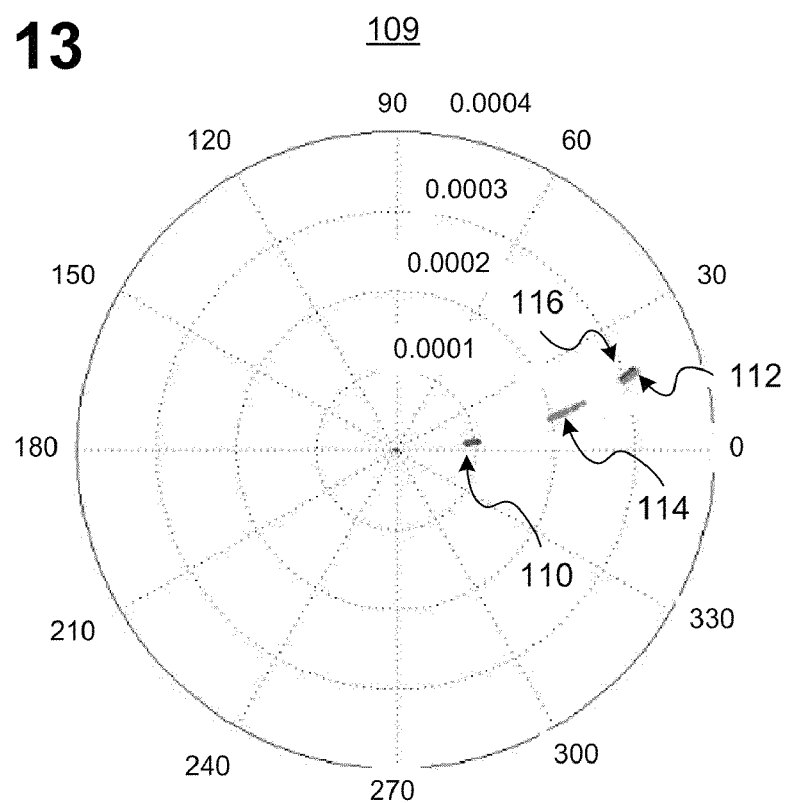
FIG. 13 is a polar plot of an example of a piezoelectric transducer with an improper dynamic response in a torque test according to an embodiment.

FIG. 13 shows a polar plot 109 of a malfunctioning accelerometer with the poor response from the torque test. In the illustrated example, data cluster 110 represents the accelerometer's dynamic response to the pulse at 40 in-lbs of torque, data cluster 112 represents the accelerometer's dynamic response to the pulse at 30 in-lbs of torque, data cluster 114 represents the accelerometer's dynamic response to the pulse at 20 in-lbs of torque, and cluster 116 represents the accelerometer's dynamic response to the pulse at 10 in-lbs of torque. Because no discernable changes are found in the frequency characteristics as measured, the accelerometer can be determined to be operating incorrectly. This occurrence can indicate that the sensor is not responding to the structural coupling with the steel block, thus operating incorrectly.

Figure 14:
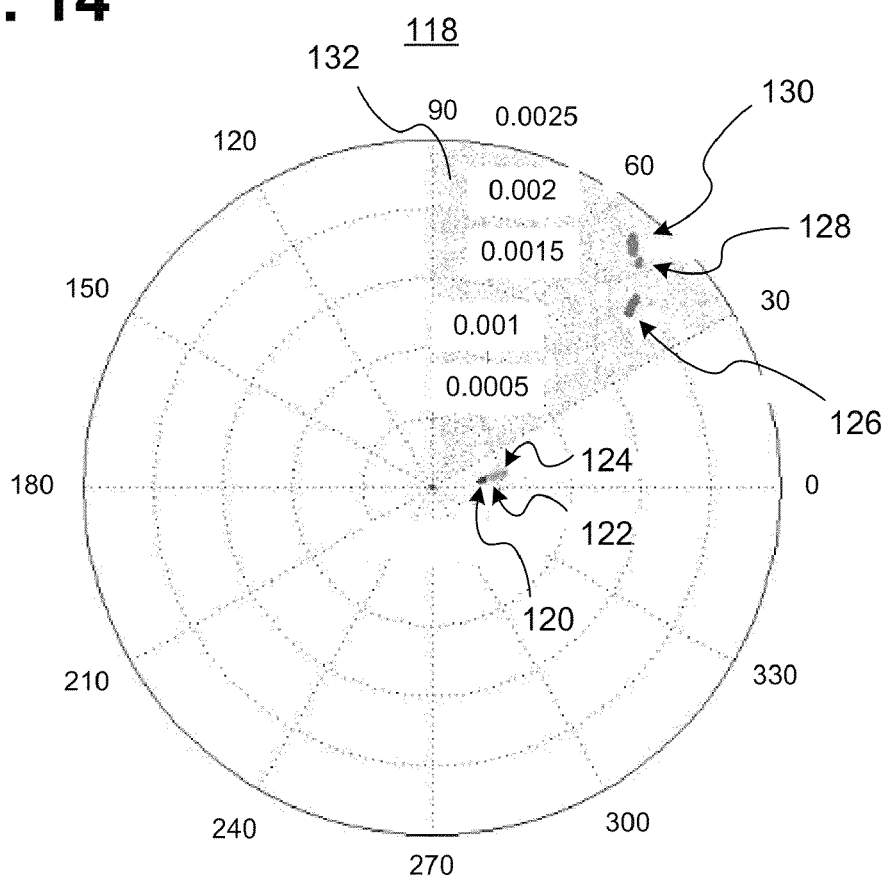
FIG. 14 is a polar plot of an example of a piezoelectric transducer's response before and after becoming inoperative according to an embodiment.

A portable, battery powered field-deployable test unit can also be constructed with the ability to perform piezoelectric tests by connecting into an instrument cable. Such a solution could be similar to the bench top tester system, but may be developed to be mobile. The field-deployable test unit may be used for testing instrumentation mounted in a facility. The unit can identify improperly operating piezoelectric transducers by comparing measured frequency characteristics with previously captured characteristic data sets. FIG. 14 shows a polar plot 118 that contains several sequentially collected data sets taken of an accelerometer before and after the accelerometer was broken. In particular, data cluster 120 represents the accelerometer's dynamic response to the pulse at reference time $t_0$, data cluster 122 represents the accelerometer's dynamic response to the pulse at time $t_1$, data cluster 124 represents the accelerometer's dynamic response to the pulse at time $t_2$, data cluster 126 represents the accelerometer's dynamic response to the pulse at time $t_3$, data cluster 128 represents the accelerometer's dynamic response to the pulse at time $t_4$, and data cluster 130 represents the accelerometer's dynamic response to the pulse at time $t_5$, wherein region 132 may be defined as the region out of normal operation limits.

Initial research indicated the transducer's preferred cable length capable of obtaining a good frequency characterization might be limited to approximately 20 feet. In particular, the highly dynamic response from a transducer under test could yield important high-frequency data that may not be readable through a significantly longer cable. The longer a cable, the more the high frequencies are attenuated by the cable's capacitance. Further research, however, made it possible to use longer transducer cabling. In fact, the cable length used is a consideration with the testing systems, but no longer a significant limitation. The testing systems are capable of collecting a good frequency characterization over 250 feet of cable by accounting for the cable's attenuation.

Figure 15:
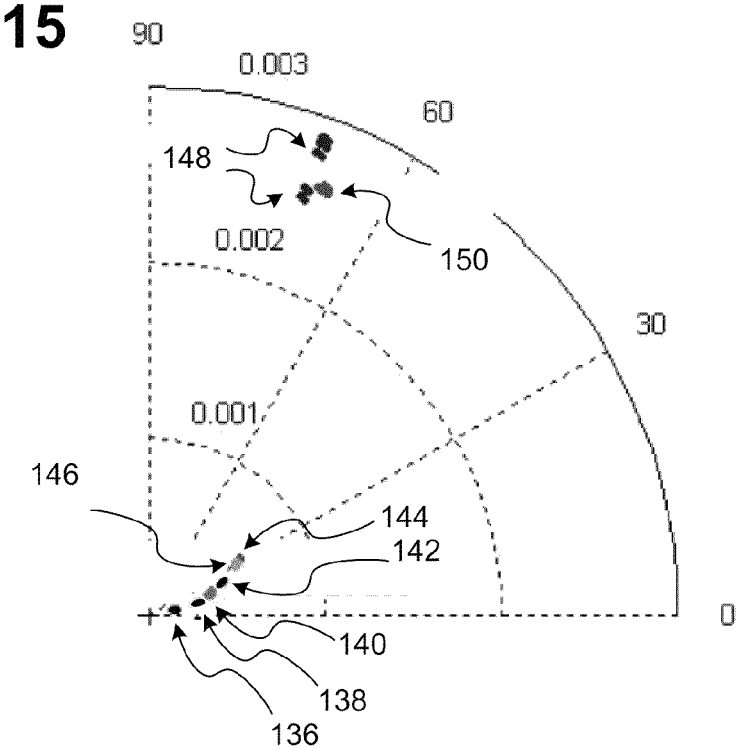
FIG. 15 is a polar plot of an example of a piezoelectric transducer's response before and after becoming detached from a structure according to an embodiment.

FIG. 15 shows a polar plot 134 that contains several sequentially collected data sets taken from an accelerometer mounted in the field, over which time it became detached. The data used in this polar plot was collected through a 200 foot RG-174 coaxial cable. In particular, data cluster 136 represents the accelerometer's dynamic response to the pulse at reference time $t_0$, data cluster 138 represents the accelerometer's dynamic response to the pulse at time $t_1$, data cluster 140 represents the accelerometer's dynamic response to the pulse at time $t_2$, data cluster 142 represents the accelerometer's dynamic response to the pulse at time $t_3$, data cluster 144 represents the accelerometer's dynamic response to the pulse at time $t_4$, data cluster 146 represents the accelerometer's dynamic response to the pulse at time $t_5$, data cluster 148 represents the accelerometer's dynamic response to the pulse at time $t_6$, and data cluster 150 represents the accelerometer's dynamic response to the pulse at time $t_7$. In the illustrated example, the accelerometer was visibly detached by time $t_6$.

Out of normal operation limits can be applied to the polar plots already discussed. This technique can alert a user that the tested transducer has significantly changed and indicate that the transducer requires maintenance. The testing unit may also provide the ability to store and track a transducer's operational history. This might be accomplished by measuring the as-mounted frequency characteristics and storing them under the transducer's serial number. A slight change in the tracked history can enable a user to make important diagnosis about a transducer, such as the condition of an accelerometer attachment to a test article.

Figure 16:
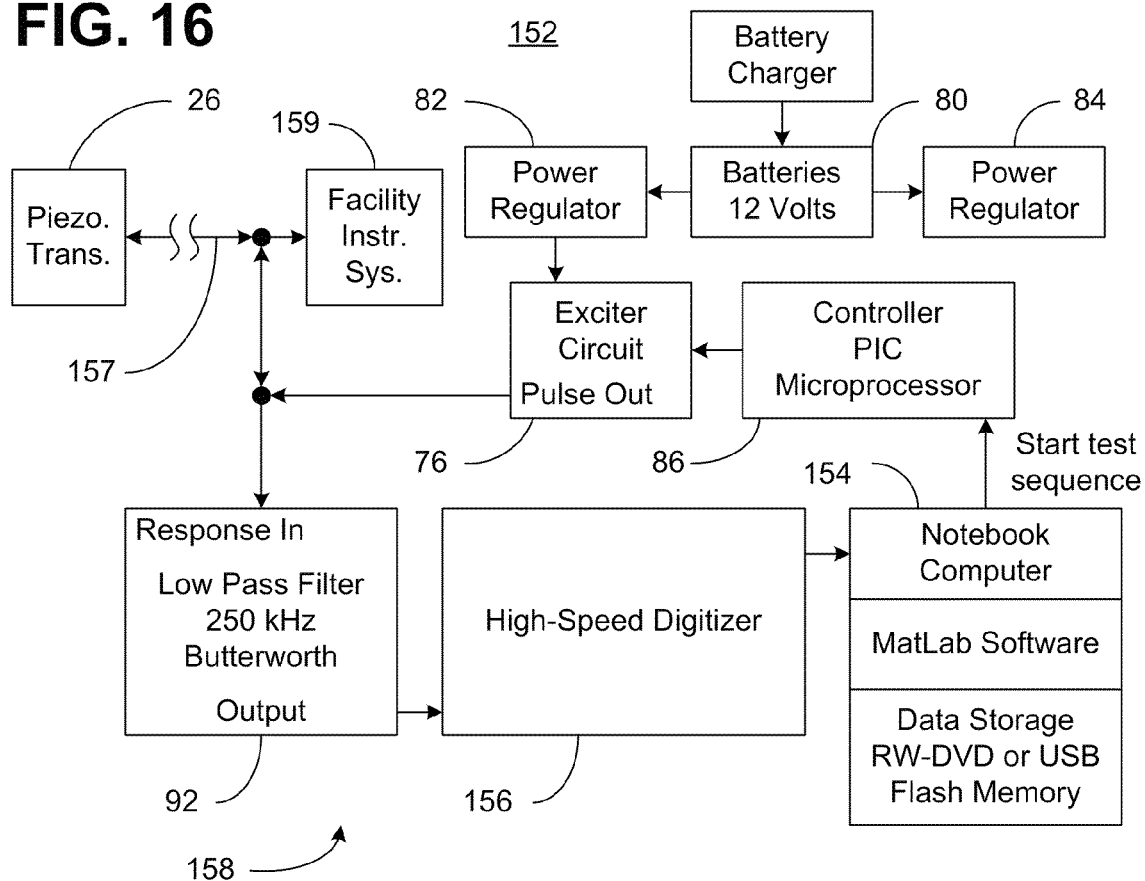
FIG. 16 is a block diagram of an example of a field deployable test unit according to an embodiment.

Turning now to FIG. 16, a field-deployable test unit 152, which may be housed in a watertight carrying case, is shown. In the illustrated example an instrument cable 157 (e.g., hundreds of feet in length) connects the piezoelectric transducer 26 to the remaining components of the system, including the testing unit and facility instrumentation systems 159. A notebook computer 154 may be used in place of the workstation computer 78 (FIG. 9), already discussed. The computer 154 may use several MatLab executable processes, wherein a Labview control screen controls the operation of the system and a digital oscilloscope 156 is used to collect the data from the transducers.

Figure 17:
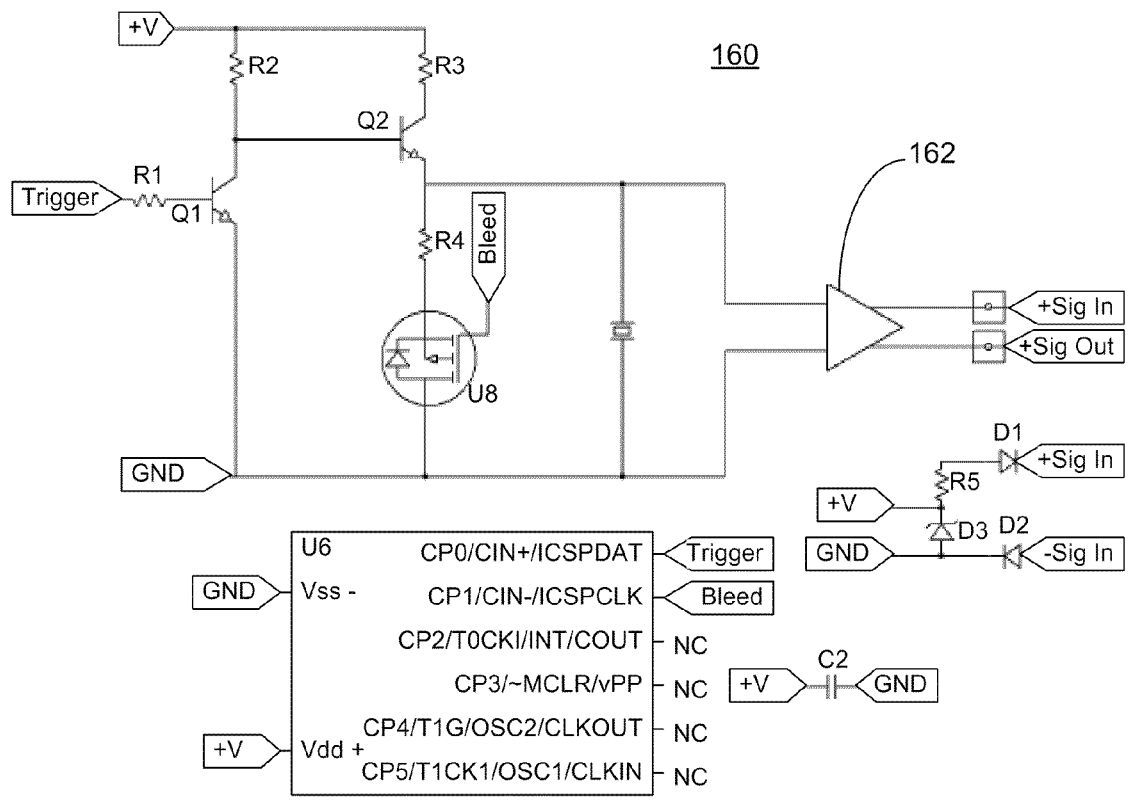
FIG. 17 is a schematic diagram of an example of an exciter circuit with a charge converter according to an embodiment.

FIG. 17 shows a schematic of an exciter circuit 160 combined with a charge converter 162 for use in a facility installable testing system. The illustrated exciter circuit 160 is directly embedded into a transducer body or inserted into an instrument cable. The component may enable the signal conditioning to perform piezoelectric testing as part of the facilities instrumentation system. The exciter circuit 160 can expand the test systems for use on piezoelectric sensors which contain charge converters. These transducers have built in amplifiers that convert the electrical charges generated by the transducers into voltage signals. This charge to voltage conversion inside of the transducer can make the signal less susceptible to changes in the cable. Accordingly, the exciter circuit 160 may be combined with a charge converter 162.

Figure 18:
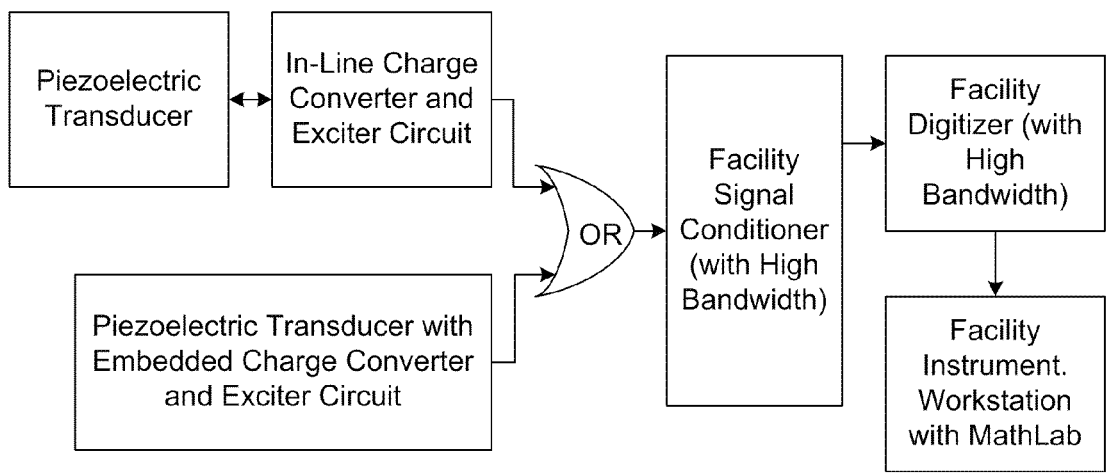
FIG. 18 is a block diagram of an example of a facility installable testing system according to an embodiment.

The exciter circuit 160 can initiate a test sequence when the instrument channel is powered on. The transducer's response to the exciter module may be transmitted over the same cable as the transducer's response to normal data. After the exciter test is completed, the instrument channel will operate in a normal fashion. The potential difference from ground to a standard DC level placed on the instrumentation cable can be sufficient to power the exciter module in a similar manner to the way a piezoelectric charge converter is powered. The transducer's signal will then ride on the DC offset. The channel power-up can then trigger software in the instrumentation control stations that process the received frequency response data. Regular signal conditioning equipment can be used with the exciter circuit 160 without any modifications. A block diagram of a scheme 164 for integrating a facility installable testing system into a facility instrumentation system is shown in FIG. 18.

Figure 19:
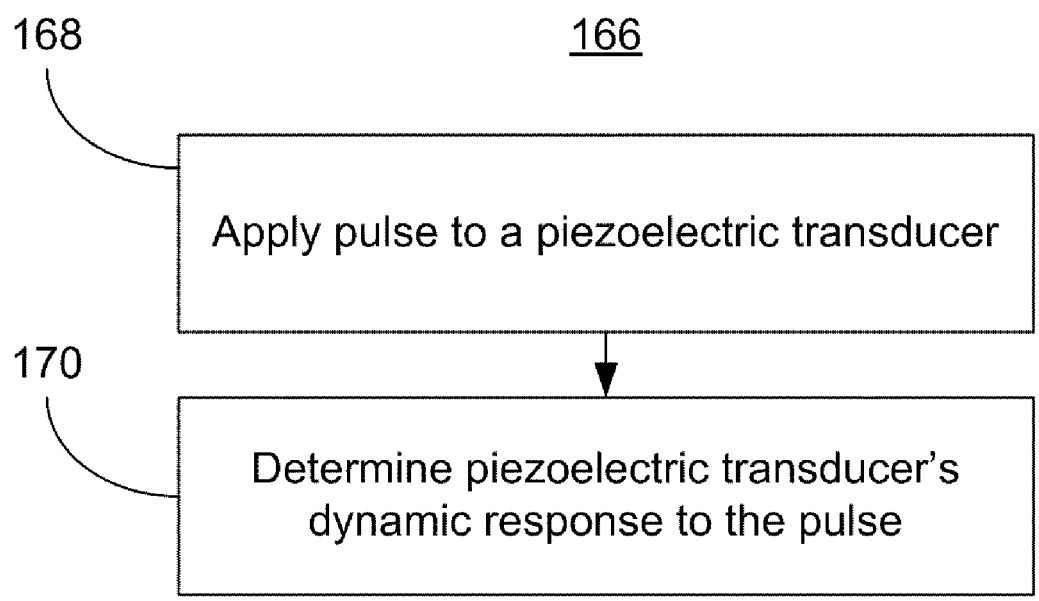
FIG. 19 is a flowchart of an example of a method of evaluating a piezoelectric transducer according to an embodiment.

Turning now to FIG. 19, a method 166 is shown. The method 166 may be implemented in executable software as a set of logic instructions stored in a machine- or computer-readable medium of a memory such as random access memory (RAM), read only memory (ROM), programmable ROM (PROM), flash memory, etc., in fixed-functionality hardware using circuit technology such as application specific integrated circuit (ASIC), complementary metal oxide semiconductor (CMOS) or transistor-transistor logic (TTL) technology, or any combination thereof. For example, computer program code to carry out operations shown in method 166 may be written in any combination of one or more programming languages, including an object oriented programming language such as Java, Smalltalk, C++ or the like, and conventional procedural programming languages, such as the "C" programming language or similar programming languages. Illustrated processing block 168 provides for applying a pulse to a piezoelectric transducer. As already discussed, the pulse may be applied by initiating an appropriate trigger signal from a controller or other device. The piezoelectric transducer's dynamic response to the pulse can be determined at block 170. The method 166 may be repeated to obtain a set of spectrum response data, which may be compared to subsequently obtained spectrum response data to identify a wide variety of system changes.

The developed in situ piezoelectric test system formed in accordance with embodiments of the present invention includes several enhancements and innovations not found in conventional assemblies. The test apparatus of embodiments of the present invention is far simpler in design and construction as compared to conventional assemblies. Testing devices formed in accordance with embodiments of the present invention require no coupling or decoupling components. Previously, components such as changeover switches and transformers were necessary. Conventional assemblies also may employ a bipolar wave (positive and negative) of some form for exciting the transducer's resonation. Certain embodiments of the present invention only require that a simple positive pulse be injected for exciting the transducer's resonance.

A unique functionality of a monitoring apparatus constructed in accordance with embodiments of the present invention resides in the ability to monitor the health of a transducer, but it is not limited to this function alone. The apparatus can detect changes in frequency characteristics indicating flaws in manufactured parts. Or, the apparatus can detect changes that could indicate a test article failure has occurred. In fact, such an apparatus may also be used for non-destructive testing. The developed test apparatus can perform a far more comprehensive test by detecting changes in the transducer element, transducer housing, transducer attachment, and test article. The sensor's piezoelectric element with a simple circuit can excite resonances in the transducer and test structure. The element may function as an electric harmonic energizer for the entire system unlike conventional solutions. Utilizing the element in this manner may provide the ability to perform resonant frequency analysis on a test article without the need for a mechanical mechanism. Embodiments of the present invention can also monitor all resonant frequencies, not just the primary resonate frequency unlike other known solutions. Indeed, the transducer's primary resonate frequency can remain unknown. In comparison, conventional sensors target the resonate frequency, and requires the primary resonate frequency to be known before testing.

Some transducers may have built in amplifiers that convert the generated electrical charges into voltage signals. It is envisioned that embodiments of the present invention may be employed in these kinds of transducers. The charge-to-voltage conversion inside of the transducer can make the signal less susceptible to changes in cable length. This aspect may be an important advantage of embodiments of the present invention when utilized with this class of piezoelectric devices. The in situ piezoelectric test system of embodiments of the present invention, when used in conjunction with the charge converters, can significantly enhance the capability of piezoelectric sensor devices.

The term "coupled" is used herein to refer to any type of relationship, direct or indirect, between the components in question, and may apply to electrical, mechanical, fluid, optical, electromagnetic, electromechanical, or other connections. In addition, the terms "first", "second", etc. are used herein only to facilitate discussion, and carry no particular temporal or chronological significance unless otherwise indicated.

Those skilled in the art will appreciate from the foregoing description that the broad techniques of the embodiments of the present invention can be implemented in a variety of forms. Therefore, while the embodiments of this invention have been described in connection with particular examples thereof, the true scope of the embodiments of the invention should not be so limited since other modifications will become apparent to the skilled practitioner upon a study of the drawings, specification, and following claims.

We claim:

1. An apparatus comprising:
   an exciter circuit to apply a first excitation pulse to a piezoelectric transducer; and
   a data processing system to determine the piezoelectric transducer's dynamic response to the first excitation pulse, wherein the first excitation pulse is to be a single positive pulse that excites a plurality of resonant frequencies in the transducer and the dynamic response is to be a wideband frequency response.

2. The apparatus of claim 1, wherein the exciter circuit is to apply a plurality of first excitation pulses to the piezoelectric transducer, and the data processing system is to determine a first set of spectrum response data based on the piezoelectric transducer's dynamic response to the plurality of first excitation pulses and generate an evaluation output based on the first set of spectrum response data.

3. The apparatus of claim 2, wherein the evaluation output is to identify an operating range of the piezoelectric transducer.

4. The apparatus of claim 2, wherein the evaluation output is to identify a resonance frequency of the piezoelectric transducer.

5. The apparatus of claim 4, wherein the resonance frequency is an as-mounted resonance frequency.

6. The apparatus of claim 2, wherein the exciter circuit is to apply a plurality of second excitation pulses to the piezoelectric transducer, and the data processing system is to determine a second set of spectrum response data based on the piezoelectric transducer's dynamic response to the plurality of second excitation pulses and further generate the evaluation output based on the first and second sets of spectrum response data.

7. The apparatus of claim 6, wherein the evaluation output is to verify a health of the piezoelectric transducer.

8. The apparatus of claim 6, wherein the evaluation output is to identify a strength of a coupling between the piezoelectric transducer and a structure.

9. The apparatus of claim 8, wherein the evaluation output is to verify a health of the structure.

10. The apparatus of claim 2, wherein the evaluation output is to include a polar plot.

11. The apparatus of claim 1, further including an in-line charge converter coupled to the exciter circuit.

12. The apparatus of claim 1, further including:
a controller to generate a trigger signal, the exciter circuit to apply the first excitation pulse in response to the trigger signal; and
an instrument cable coupled to the controller, the piezoelectric transducer, the exciter circuit and the data processing system, the instrument cable to carry the trigger signal from the controller to the exciter circuit, carry raw spectrum response data from the piezoelectric transducer to the data processing system, and carry accelerometer measurement data from the piezoelectric transducer to the data processing system.

13. An apparatus comprising:
a controller to generate a first trigger signal and a second trigger signal;
an exciter circuit to apply a plurality of first excitation pulses to a piezoelectric accelerometer in response to the first trigger signal and apply a plurality of second excitation pulses to the piezoelectric accelerometer in response to the second trigger signal;
a data processing system to determine a first set of spectrum response data based on the piezoelectric accelerometer's dynamic response to the plurality of first excitation pulses, determine a second set of spectrum response data based on the piezoelectric accelerometer's dynamic response to the plurality of second excitation pulses, and generate a polar plot based on the first and second sets of spectrum response data; and
an instrument cable coupled to the controller, the piezoelectric accelerometer, the exciter circuit and the data processing system, the instrument cable to carry the first and second trigger signals from the controller to the exciter circuit, carry raw spectrum response data from the piezoelectric accelerometer to the data processing system, and carry accelerometer measurement data from the piezoelectric accelerometer to the data processing system.

14. The apparatus of claim 13, wherein the polar plot is to identify a strength of a coupling between the piezoelectric accelerometer and a structure.

15. The apparatus of claim 14, wherein the polar plot is to identify a health of the structure.

16. The apparatus of claim 14, wherein the polar plot is to identify an as-mounted resonance frequency of the piezoelectric accelerometer.

17. A method comprising:
applying a first excitation pulse to a piezoelectric transducer; and
determining the piezoelectric transducer's dynamic response to the first excitation pulse, wherein the first excitation pulse is a single positive pulse that excites a plurality of resonant frequencies in the transducer and the dynamic response is a wideband frequency response.

18. The method of claim 17, further including:
applying a plurality of first excitation pulses to the piezoelectric transducer;
determining a first set of spectrum response data based on the piezoelectric transducer's dynamic response to the plurality of first excitation pulses; and
generating an evaluation output based on the first set of spectrum response data.

19. The method of claim 18, further including:
applying a plurality of second excitation pulses to the piezoelectric transducer;
determining a second set of spectrum response data based on the piezoelectric transducer's dynamic response to the plurality of second excitation pulses; and
generating the evaluation output based on the fists and second sets of spectrum response data.

20. The method of claim 17, wherein the dynamic response is obtained from an element of the piezoelectric transducer, the method further including using the element to obtain an operational measurement.

21. The apparatus of claim 1, wherein the first excitation pulse does not mix with the wideband frequency response of the piezoelectric transducer.

* * * * *